US008799704B2

(12) United States Patent
Ossimitz

(10) Patent No.: US 8,799,704 B2
(45) Date of Patent: Aug. 5, 2014

(54) SEMICONDUCTOR MEMORY COMPONENT HAVING A DIVERTING CIRCUIT

(75) Inventor: Peter Ossimitz, Munich (DE)

(73) Assignee: Infineon Technologies AG, Neubiberg (DE)

( * ) Notice: Subject to any disclaimer, the term of this patent is extended or adjusted under 35 U.S.C. 154(b) by 301 days.

(21) Appl. No.: 11/693,373

(22) Filed: Mar. 29, 2007

(65) Prior Publication Data

US 2008/0016391 A1    Jan. 17, 2008

Related U.S. Application Data

(63) Continuation of application No. PCT/DE2005/001737, filed on Sep. 29, 2005.

(30) Foreign Application Priority Data

Sep. 29, 2004  (DE) .......................... 10 2004 047 813

(51) Int. Cl.
*G06F 11/20*  (2006.01)
*G11C 16/20*  (2006.01)
*G11C 29/00*  (2006.01)

(52) U.S. Cl.
CPC ............... *G11C 29/78* (2013.01); *G11C 16/20* (2013.01); *G11C 29/846* (2013.01)
USPC .......... 714/6.13; 714/6.32; 714/710; 714/723

(58) Field of Classification Search
CPC . G06F 12/0638; G06F 11/1666; G11C 29/70; G11C 29/76
USPC .......... 714/7, 5, 8, 29, 42, 718, 719, 723, 5.1, 714/710, 711, 6.13, 6.32; 711/156, 159
See application file for complete search history.

(56) References Cited

U.S. PATENT DOCUMENTS

| 4,473,895 A | | 9/1984 | Tatematsu |
| 4,939,694 A | * | 7/1990 | Eaton et al. .................... 365/200 |
| 5,434,870 A | * | 7/1995 | Benton et al. .................. 714/752 |
| 5,680,544 A | * | 10/1997 | Edmondson et al. ........... 714/42 |

(Continued)

FOREIGN PATENT DOCUMENTS

| DE | 239061 | 9/1986 |
| DE | 102004039831 | 3/2005 |
| EP | 0957430 | 11/1999 |

OTHER PUBLICATIONS

Wordnet Search definition of "Database" http://wordnetweb.princeton.edu/perl/webwn?s=database retrieved Jun. 19, 2009.*

(Continued)

*Primary Examiner* — Joseph Schell
(74) *Attorney, Agent, or Firm* — Banner & Witcoff, Ltd.

(57) ABSTRACT

A method for correcting faults in semiconductor memory components provides an application system having a multi-chip module (1) which has a semiconductor memory component (2) containing a volatile memory and a diverting circuit (7). When the application system is being booted up, addresses of faulty memory cells in the semiconductor memory component (2) are loaded into the multichip module (1), with the result that the diverting circuit (7) diverts access to a memory cell in the replacement data memory if a faulty memory cell in the semiconductor memory component (2) is accessed.

27 Claims, 1 Drawing Sheet

(56) References Cited

U.S. PATENT DOCUMENTS

| | | | |
|---|---|---|---|
| 5,694,611 A * | 12/1997 | Matsubara | 712/39 |
| 5,867,505 A * | 2/1999 | Beffa | 714/718 |
| 5,920,513 A * | 7/1999 | Jacobson | 365/200 |
| 5,935,258 A * | 8/1999 | Klein | 714/8 |
| 6,009,536 A | 12/1999 | Rohwer | |
| 6,041,422 A * | 3/2000 | Deas | 714/6.13 |
| 6,141,267 A | 10/2000 | Kirihata et al. | |
| 6,202,180 B1 * | 3/2001 | Nose | 714/718 |
| 6,330,697 B1 * | 12/2001 | Clinton et al. | 714/721 |
| 6,467,048 B1 * | 10/2002 | Olarig et al. | 714/7 |
| 6,556,490 B2 * | 4/2003 | Shubat et al. | 365/200 |
| 6,732,291 B1 * | 5/2004 | Kilmer et al. | 714/7 |
| 6,745,147 B2 * | 6/2004 | Ahrens, Jr. et al. | 702/127 |
| 6,914,846 B2 * | 7/2005 | Harari et al. | 365/230.03 |
| 6,968,479 B2 * | 11/2005 | Wyatt et al. | 714/53 |
| 7,149,135 B2 * | 12/2006 | Okuno | 365/200 |
| 7,181,655 B2 * | 2/2007 | Ditewig et al. | 714/53 |
| 7,359,261 B1 * | 4/2008 | Wu et al. | 365/200 |
| 7,734,966 B1 * | 6/2010 | Lee et al. | 714/718 |
| 7,940,582 B2 * | 5/2011 | Fekih-Romdhane | 365/200 |
| 2004/0006404 A1 | 1/2004 | McAdams et al. | |
| 2004/0041580 A1 * | 3/2004 | Ogawa | 324/765 |
| 2004/0059970 A1 * | 3/2004 | Wieberdink et al. | 714/724 |
| 2005/0018517 A1 * | 1/2005 | Collura et al. | 365/225.7 |
| 2005/0060604 A1 * | 3/2005 | Goodwin et al. | 714/7 |
| 2005/0086564 A1 * | 4/2005 | Frankowsky et al. | 714/718 |
| 2006/0085700 A1 * | 4/2006 | Fong | 714/710 |
| 2007/0033350 A1 * | 2/2007 | Shen et al. | 711/154 |
| 2008/0016391 A1 * | 1/2008 | Ossimitz | 714/6 |

OTHER PUBLICATIONS

Watch Your Back: The Mounting Risks of Unauthorized Data Access, Theft and Corruption in Secondary Storage by Scott Gordon, published Feb. 1, 2003 http://www.accessmylibrary.com/coms2/summary_0286-22683546_ITM.*

The Nordic Electronic Packaging Guideline by Gleditsch, Krisitansen and Ausen published Feb. 1, 2001 as found by Google's History http://extra.ivf.se/ngl/documents/ChapterF/chapterF.pdf.*

Examination Report for DE 102004047813.9-55 dated Apr. 13, 2005.

International Search Report and Written Opinion for PCT/DE2005/001737 dated Jan. 18, 2006.

International Preliminary Report for PCT/DE2005/001737 dated Apr. 3, 2007.

* cited by examiner

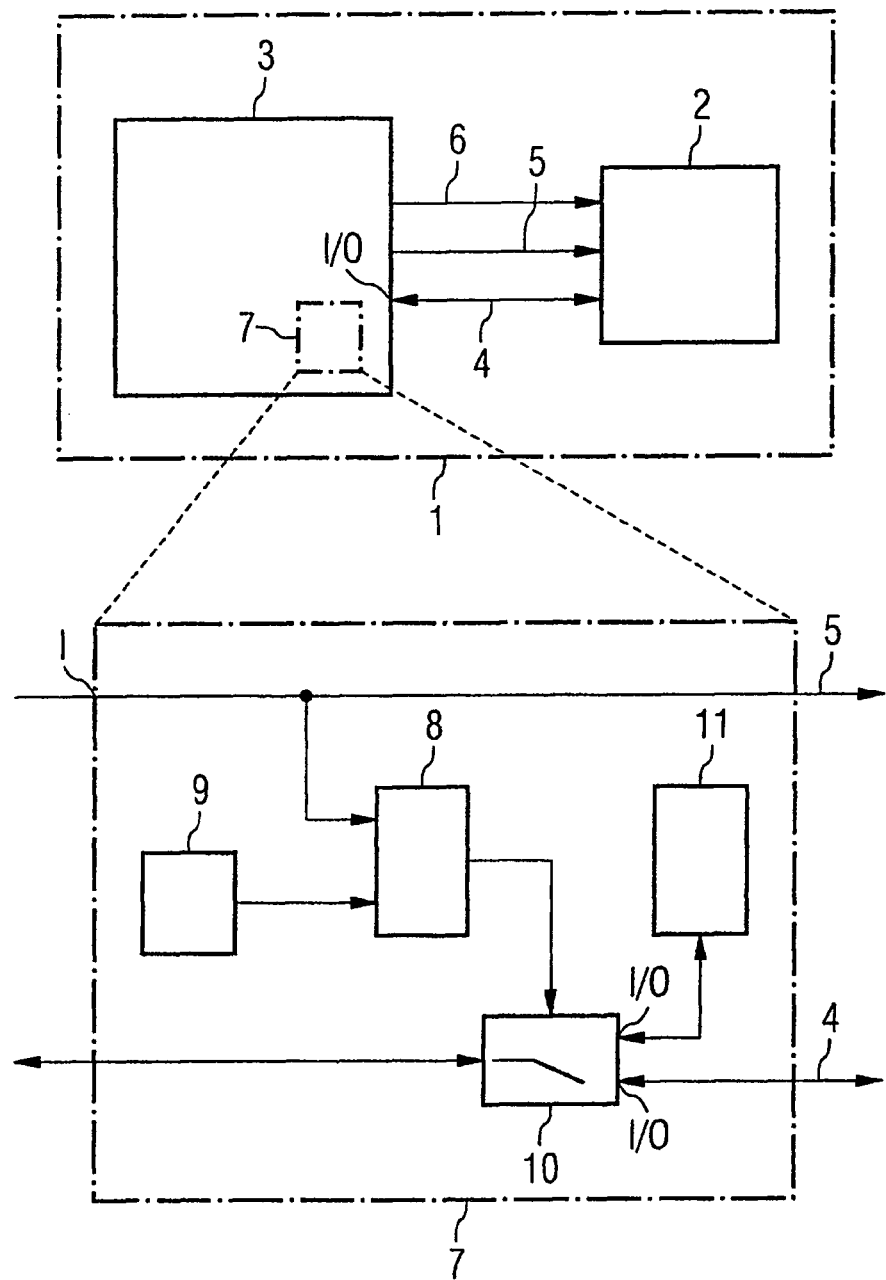

SEMICONDUCTOR MEMORY COMPONENT HAVING A DIVERTING CIRCUIT

CROSS-REFERENCE TO RELATED APPLICATION

This application is a continuation of co-pending International Application No. PCT/DE2005/001737 filed Sep. 29, 2005, which designates the United States, and claims priority to German application number DE 10 2004 047 813.9 filed Sep. 29, 2004.

TECHNICAL FIELD

The invention relates to a method for correcting faults in semiconductor memory components.

BACKGROUND

On account of the physical conditions when fabricating integrated semiconductor chips at the wafer level and during the further fabrication steps until the semiconductor memory components are in the package, it is virtually impossible to avoid some of the multiplicity of memory cells in the integrated semiconductor memory components already being defective during or after fabrication. In order to enable correct and reliable operation of these semiconductor memory components in the application system environment in which they are used, for example in mobile telephones, notebooks, PCs etc., the defective memory cells are often replaced with redundant memory cells which are likewise present in the integrated semiconductor memory component.

In this case, DE 10 2004 039 831 adopts the approach of arranging redundant memory cells for the integrated semiconductor memory component affected, which has a volatile memory such as a dynamic RAM (DRAM) memory, in the logic chip of a multichip module, said logic chip being in the form of a digital signal processor or a processor/CPU, in particular, rather than in the volatile memory itself. The nonvolatile memory area used may also be, in particular, in the form of an electrically programmable connection for permanently storing a data item, which is also referred to as an E-fuse. In this case, a diversion is effected in such a manner that, when the defective memory cells are accessed, a diversion to these E-fuses is effected. In this case, it is disadvantageous that such E-fuses are often not available in the multichip module used or would have to be additionally provided, which is often not possible.

DD 239 061 exhibits a multichip hybrid memory containing two memory chips and two programmable logic blocks. The latter identify defective columns and rows and switch back and forth between a basic memory and a redundancy chip.

US 2004/0006404 exhibits "ID" memories which store information relating to the production, testing and performance of a chip. In U.S. Pat. No. 4,473,895, main memory cells and redundancy memory cells are activated at the same time.

SUMMARY

In an integrated semiconductor memory component, defective memory cells can be replaced with operational memory cells in a simple and reliable manner. According to an embodiment, a method for correcting faults in semiconductor memory components in an application system, may comprise the following successive steps: a) providing an application system having a multichip module, the multichip module comprising:—at least one semiconductor memory component containing a volatile memory,—as well as a logic component, in particular a processor/CPU or a digital signal processor,—as well as a diverting circuit and a replacement data memory which, in particular, are on the logic component; b) booting up of the application system; c) reading addresses of earmarked faulty memory cells in the semiconductor memory component into the multichip module from the application system; and d) operating the application system having the semiconductor memory component in such a manner that, if an earmarked memory cell in the semiconductor memory component is accessed, the diverting circuit diverts access to a memory cell in the replacement data memory.

BRIEF DESCRIPTION OF THE DRAWINGS

The invention is illustrated in more detail in the FIGURE using an exemplary embodiment.

DETAILED DESCRIPTION

According to an embodiment, a method is provided for correcting faults in semiconductor memory components. The latter are in an application system, for example a microcomputer or a mobile telephone. According to an embodiment, an application system may have a multichip module is first of all provided. The multichip module contains a replacement data memory and a semiconductor memory component containing a volatile memory. According to an embodiment, the replacement data memory may be constructed from different types of memory such as SRAM, register flip-flops or DRAM. According to an embodiment, the semiconductor memory component may be in the form of a chip.

According to an embodiment, the multichip module additionally may contain a logic component, which is, in particular, a processor/CPU and/or a digital signal processor, and a diverting circuit. According to an embodiment, the diverting circuit and the replacement data memory can be outside the semiconductor memory component and are fitted, in particular, to the logic component. According to an embodiment, after the application system has been provided, the application system can be booted up by restarting and initializing the application system, for example by reapplying the voltage supply or by pressing a reset button. According to an embodiment, after the booting-up operation, the addresses of earmarked faulty memory cells in the semiconductor memory component can be read into the multichip module from the application system. According to an embodiment, the earmarked addresses may be stored in the logic chip in flip-flop registers, for example.

According to an embodiment, the application system having the semiconductor memory component is then operated in such a manner that a diverting circuit diverts access to a memory cell in the replacement data memory if an earmarked memory cell in the semiconductor memory component is accessed. As a result, no E-fuses or flash memories advantageously need to be provided in the multichip module. Additional special fabrication steps which make the fabrication technology for a semiconductor component more complicated and thus more expensive are usually required for E-fuses and flash memories.

Particularly high or particularly low voltages, for example of +12 V or −12 V, are often needed to program E-fuses or flash memories, dedicated voltage supplies such as pumps having to be provided for said voltages. According to an embodiment, these voltage supply circuits do not need to be provided in the multichip module either in which space is limited. A flash memory which can be used is often already present anyway in mobile telephones, for example.

In one embodiment, the addresses of the earmarked faulty memory cells in the semiconductor memory component are read into the multichip module from an external database via the application system by means of an electronic data connection.

In one simple embodiment, the memory cell addresses and the identification number of the semiconductor memory component can be read into the application system in such a manner that these data are read, for example, from a marking, a label or a data sheet and are manually input into the application system.

If the external database provided has a defined number of memory cell addresses, only some of which are faulty, this entails the advantage that a diversion is effected, in principle, for a defined number of memory cells without the person using the application system noticing or having to deal with how many and which memory cells are defective, according to an embodiment.

This may also be additionally ensured by storing the addresses of the memory cells, according to an embodiment, in encrypted form in the external database provided and by the logic component, for example, decrypting these addresses.

According to an embodiment, an identification number is preferably additionally read into the multichip module from the application system. This may be necessary, if the multichip module contains a plurality of semiconductor memory components containing a volatile memory, in order to correctly assign the earmarked addresses.

According to an embodiment, furthermore, provision may also be made of a checking step which determines whether the identification number of the semiconductor memory component that has been read in matches the actual identification number of the semiconductor memory component in the application system. This makes it possible to reliably avoid assignment errors.

According to an embodiment, after the booting-up operation, the addresses of the earmarked memory cells may be directly applied to the diverting circuit. As an alternative to this, it is possible to store the addresses of the earmarked memory cells in the local memory unit which is itself connected to the diverting circuit or is part of the latter. According to an embodiment, the addresses of the earmarked memory cells are then applied to the diverting circuit by the local memory unit. This entails the advantages that the addresses of the memory cells to be diverted are stored in compressed form and particularly rapid access is possible.

According to an embodiment, in order to generate the addresses of the faulty memory cells, a semiconductor memory component is first of all provided at the wafer level or in the multichip package and is then tested. To this end, the identification number is also read out. The memory cells which are identified as being faulty during the test are stored, together with the identification number, in an external database or a label or marking on the multichip module. An external database is a database outside the multichip module. When assembling the application system, for example, said database can be accessed in order to load the addresses into the application system. It is also possible to provide the external database during possible operation of the application system using a data network, with the result that, each time the application system is booted up, the external database is accessed using a mobile radio network or the Internet in order to retrieve the addresses of faulty memory cells.

This method makes it possible to generate the fault information relating to a semiconductor memory component in compact form. In this case, the information relating to faulty memory cells is advantageously permanently stored and not erased as in a conventional test method. According to an embodiment, the results of all tests carried out during the production method, in particular tests on the semiconductor chip or chips at the wafer level which accompany production, memory functional tests on the semiconductor memory components which have already been sawn up and/or on the semiconductor memory components which are already in the package as well as the burn-in tests on the semiconductor memory components in which the latter are tested under stress and thermal loading, are accessed. In this case, the results of one or more of these tests are combined and the addresses of the memory cells identified as being faulty are stored in compressed form.

According to an embodiment, the fault information is stored in a file for each measurement operation involving each semiconductor memory component. It is provided in a database under the serial number of the semiconductor device. As an alternative to this, according to an embodiment, this information may be forwarded with the module in a machine-readable language, for example using a bar code.

When constructing the application system, the person using the components loads these data into a memory of said application system. According to an embodiment, this memory may, for example, contain flash memory cells.

This is preferably effected by using an identification number which has been read from the semiconductor memory component to read the faulty addresses of this semiconductor memory component from the external database or from the label or marking. According to an embodiment, that data record which belongs to the semiconductor memory component of the application system is found in the database or on the label using the identification number. According to an embodiment, the fault addresses are then loaded into the memory of the application system as described above.

In another embodiment of this method in which storage is effected in an external database, a further external database, which accepts the addresses of the memory cells in the semiconductor memory component which are identified as being faulty, is created, this further external database additionally being filled with further addresses of operational memory cells in the semiconductor memory component until a defined prescribable number of addresses of memory cells has been reached. This method generates a generic data packet of memory cell addresses which has the same amount of data for all semiconductor memory components. This ensures that the person using the semiconductor memory component that has been produced does not specifically notice or have to deal with precisely which memory cells are faulty.

According to an embodiment, furthermore, it may be advantageous to apply an encryption code to the addresses of the memory cells to be stored in the external database or in the two external databases in advance in order to avoid making the information regarding the memory cells which are now specifically faulty available to everyone.

According to an embodiment, the label on the chip or the packaging of the latter may be provided with a machine-readable code, for example a two-dimensional bar code. In order to ensure fault-free operation of the semiconductor memory component which is afflicted with faults per se, it is necessary to provide or deliver the fault information generated in this manner together with the corresponding semiconductor memory component. This involves virtually importing the repair data to the application level. These data may also be delivered on a transportable data storage medium such as a CD or DVD or the like.

However, before the application system is provided, the addresses of the faulty memory cells are preferably stored in a non-volatile memory which is inside the application system but outside the multichip module, according to an embodiment. As a result, the address data are always available inside the application system and do not need to be respectively reloaded into the application system each time the latter is booted up.

According to an embodiment, a multichip module (MCM) is able to carry out automatic diversion to an operational memory cell in a replacement data memory when an earmarked faulty memory cell is accessed. According to an embodiment, such an MCM may have a first external contact for connection to an address bus for transmitting addresses of memory cells to a semiconductor memory component and a second external contact for transmitting data to the semiconductor memory component and for receiving data from the latter via a data bus. Furthermore, the MCM, according to an embodiment, may have a diverting circuit which is connected to the first external contact for the purpose of reading in memory cell addresses and has a memory area for holding earmarked addresses of faulty memory cells in the semiconductor memory component. This diverting circuit is able to divert the data bus to the replacement data memory if a memory cell address of the semiconductor memory component that is applied to the address bus is earmarked and the corresponding memory cell is thus faulty.

According to an embodiment, the fault information needed to repair the semiconductor memory component is moved to a memory area outside the MCM. Before the MCM having the semiconductor memory component is operated, it is therefore necessary to store the fault information, in particular the addresses of the memory cells in the semiconductor memory component which are known to be faulty, in the memory of the MCM, according to an embodiment.

According to an embodiment, the address may also be referenced in the form of an address range having more than one single address. Bytes, byte ranges or even individual bits may thus be replaced. Entire memory pages may also be replaced at once.

According to an embodiment, an MCM which is configured in such a manner makes it possible to dispense with the costly and time-consuming repair of faulty memory cells in the semiconductor memory component, for example by means of E-fuses. Instead of this, according to an embodiment, the addresses of the memory cells in the semiconductor memory component which are identified as being faulty during the production process are earmarked and are stored in a suitable form so that the diverting circuit of the MCM which is introduced into the application environment can selectively access the semiconductor memory component or the replacement data memory. The faulty memory cells do not impair the operation of the application system since, if the defective memory cell is accessed, the diverting circuit diverts to intact memory cells in the replacement data memory. A fault-tolerant application system can, thus, be provided in which the individual memory cell faults are evaluated and corrected only when the system is being used. The fault information needed for this is externally provided.

The production yield can thus be increased by virtue of memory components which are afflicted with individual faulty memory cells and would not be operational under normal conditions and could therefore not be sold either nevertheless being used, the faulty memory cells being circumvented by the diverting circuit, according to an embodiment.

According to a first embodiment, the diverting circuit comprises a comparator, the first input of which is connected to the address bus and the second input of which can have earmarked memory cell addresses of the semiconductor memory component applied to it. This comparator reliably compares the memory cell addresses applied to its inputs for matches or discrepancies.

According to another embodiment, the diverting circuit has a local memory unit which is connected to the second input of the comparator and stores the earmarked memory cell addresses. In this case, it is advantageous that the fault information is present in compressed form and that the memory component which is not fully operational in the entire address range is accordingly repaired by virtue of a diversion to an operational memory cell in the replacement data memory being effected if a memory cell which is earmarked in the local memory unit is accessed. A further advantage which is ensured by providing a local memory unit which is connected to the diverting circuit resides in rapid access to the memory cell addresses.

Instead of providing a local memory unit, the faulty memory cell addresses may also be directly applied to the second input of the comparator, according to an embodiment.

In order to ensure the diverting function, the diverting circuit may additionally have a multiplexer which is on the data bus and the control input of which is connected to the output of the comparator, According to an embodiment. In this case, the multiplexer is designed in such a manner that the data bus is connected to the replacement data memory when the comparator determines that the memory cell addresses applied to its inputs match and thus that an earmarked faulty memory cell is being accessed. Otherwise, the data bus is connected to the semiconductor memory component. A diverting circuit configured in this manner operates in a particularly reliable manner.

If provision is furthermore made of a decryption unit which is able to decrypt earmarked encrypted memory cell addresses of the semiconductor memory component, according to an embodiment, the fault information may be interchanged between the manufacturer of the semiconductor memory components and the user in encrypted form, which affords the manufacturer the advantage that the user is not specifically aware of the faulty memory cells.

In order to check the assignment of the faulty memory cells to the respective semiconductor memory component for the sake of safety, the identification number of the semiconductor memory component may also be stored in addition to the earmarked memory cell addresses of the latter, the semiconductor memory component being able to compare said identification number with the actual identification number of the semiconductor memory component used in the application system, according to an embodiment. This makes it possible to reliably avoid assignment errors.

The diverting circuit, according to an embodiment, may be provided in different semiconductor memory components, for example in a logic component, in particular in a processor/CPU or a digital signal processor/DSP. It is likewise possible to form the diverting circuit in a further semiconductor memory component.

In particular, according to an embodiment, the user may integrate the diverting circuit as a macro in at least one of his logic blocks. As an alternative to this, the diverting circuit may be installed in its own semiconductor memory component in the MCM.

The FIGURE shows a block diagram of a multichip module 1 having an integrated semiconductor memory component 2 and a logic component 3 which has a diverting circuit 7 that is illustrated on an enlarged scale.

The integrated semiconductor memory component 2 and the logic component 3 which is in the form of a CPU or DSP, for example, and has an integrated DSP and/or CPU, for example, are in the form of separate integrated circuits which are arranged on a common multichip module 1.

The logic component 3 and the integrated semiconductor memory component 2 are connected to one another by means of a bidirectional data bus 4, an address bus 5 from the logic component 3 to the integrated semiconductor memory component 2 and a command line 6 from the logic component 3 to the integrated semiconductor memory component 2.

The diverting circuit 7 comprises a local memory unit 9 which stores earmarked memory cell addresses which have been stored in the local memory unit 9 using a data connection (not shown in the FIGURE). The diverting circuit 7 also comprises a comparator 8 whose first input is connected to the address bus 5 and whose second input is connected to the local memory unit 9. The internal address data input of the address bus 5 in the diverting circuit 7 is provided with the reference symbol I. The diverting circuit 7 also has a multiplexer 10 which is arranged on the data bus 4 and the control line of which is connected to the output of the comparator 8. The diverting circuit 7 also has a replacement data memory 11 containing operational memory cells. The first output of the multiplexer 10 is connected to the replacement data memory 11 and the second output of the multiplexer 10 is connected to the integrated semiconductor memory component 2 by means of the data bus 4. The two outputs of the multiplexer 10 are provided with the reference symbol I/O and form a data interface.

The diverting circuit 7 does not necessarily need to be formed in a logic component 3. Rather, it may also be present in a second semiconductor memory component.

The operation of the multichip module 1, according to an embodiment, is shown below.

The address data of the faulty memory cells are collected during fabrication of the integrated semiconductor memory component 2, to be precise during all of the tests which are carried out in the production process, namely during the tests on the semiconductor chips at the wafer level which accompany production, during memory tests at the semiconductor component level which can usually be used to test memory and logic components, during burn-in tests in which the functionality of the semiconductor memory components is tested under extreme stress and thermal loading, and during the subsequent conventional memory tests.

In the case of the present integrated semiconductor memory component 2, the memory cell having the address "3ff" was identified as being faulty in a memory test, for example. This address is stored together with the identification number of the integrated semiconductor memory component 2.

When assembling the application system, this information is stored in a memory of the application system, this memory being outside the multichip module 1 and not being shown in the FIGURE. In this case, the identification number of the semiconductor memory component 2 is read out. The data record which is in the external database and contains this identification number also has the faulty addresses of the semiconductor memory component 2. Said addresses are then stored in the application system.

When the application system is being booted up, this information is loaded from this memory of the application system into the local memory unit 9 of the multichip module 1.

After the current fault data have been stored in the local memory unit 9, the diverting circuit 7 is ready for operation. During normal operation of the multichip module 1, the logic component 3 accesses the data stored in the integrated semiconductor memory component 2 a large number of times. The addresses of the memory cells in the integrated semiconductor memory component 2, which are respectively applied to the comparator 8 by means of the address bus 5, are then compared by the comparator 8 in order to determine whether a respective matching address has been stored in the local memory unit 9.

When an attempt is made to access the faulty memory cell having the address "3ff" in the semiconductor memory component 2, the comparator 8 identifies the match to the memory cell address stored in the local memory unit 9 and drives the multiplexer 10 in such a manner that the logic component 3 does not access the selected memory cell in the integrated semiconductor memory component 2 but rather accesses an operational memory cell in the replacement data memory 11.

When memory cells in the semiconductor memory component 2 which have other addresses are accessed, the comparator 8 does not determine any matches. In these cases, the multiplexer 10 remains in its standard setting in which the data bus 4 is directly connected to the integrated semiconductor memory component 2.

The method can be divided into the following six steps:
1. Testing the memory component.
2. Storing the faulty addresses, for example in a database.
3. Installing the memory and logic component in the application.
4. Reading in the faulty addresses during application programming.
5. Starting the application.
6. Correcting the faulty memory addresses during operation (=changing over the MUX from faulty memory addresses).

List of Reference Symbols
1 Multichip module
2 Integrated semiconductor memory component
3 Logic component
4 Data bus
5 Address bus
6 Command line
7 Diverting circuit
8 Comparator
9 Local memory unit
10 Multiplexer
11 Replacement data memory
I Address data input
I/O Data interface

What is claimed is:
1. A method for correcting faults in at least one semiconductor memory component in an application system, said method comprising:
(a) booting up of an application system, the application system having a multichip module comprising a package into which a plurality of integrated circuit chips are placed, the multichip module comprising:
the at least one semiconductor memory component containing a volatile memory,
a logic component, and
a diverting circuit and a replacement data memory that are part of the logic component;

(b) initiating, after said booting up, regular operation of the application system;

(c) reading into the multichip module, from a non-volatile memory within the application system and outside the multichip module, addresses of earmarked faulty memory cells in the at least one semiconductor memory component, wherein said reading is performed after said booting up and during said regular operation of the application system; and (d) operating the application system having the at least one semiconductor memory component in such a manner that, responsive to one of the earmarked faulty memory cells in the at least one semiconductor memory component being accessed, the diverting circuit diverts access to a memory cell in the replacement data memory.

2. The method according to claim 1, wherein the non-volatile memory is part of an external database, and wherein step (c) comprises reading the addresses of the earmarked faulty memory cells using an electronic data connection with the external database.

3. The method according to claim 2, wherein the external database has a predetermined number of addresses of memory cells, only some of which are faulty.

4. The method according to claim 2, wherein the addresses of the earmarked faulty memory cells in the at least one semiconductor memory component are stored in encrypted form in the external database, the method further comprising decrypting, by the logic component, the addresses that are encrypted before performing step (d).

5. The method according to claim 1, wherein step (c) comprises reading at least one identification number of the at least one semiconductor memory component into the multichip module.

6. The method according to claim 5, further comprising determining, after performing step (c), whether the at least one identification number of the at least one semiconductor memory component that has been read in matches an actual identification number of the at least one semiconductor memory component in the application system.

7. The method according to claim 1, wherein step (d) comprises directly applying the addresses of the earmarked faulty memory cells to the diverting circuit.

8. The method according to claim 1, wherein step (d) comprises storing the addresses of the earmarked faulty memory cells in a local memory unit which is itself connected to the diverting circuit or is part of the diverting circuit, the method further comprising applying, by the local memory unit, the addresses of the earmarked faulty memory cells to the diverting circuit.

9. The method according to claim 1, further comprising the following steps (I) to (IV) which are carried out before steps (a) to (d):

(I) providing a-the at least one semiconductor memory component at a wafer level or in the multichip module;

(II) testing, using a testing device external to and separate from the application system, the at least one semiconductor memory component at the wafer level or in the multichip module and identifying the earmarked faulty memory cells in the at least one semiconductor memory component;

(III) reading out at least one identification number of the at least one semiconductor memory component; and (IV) associating the addresses of the earmarked faulty memory cells which are identified as being faulty in step (II) together with the at least one identification number of the at least one semiconductor memory component, by storing the addresses of the earmarked faulty memory cells in an external database that comprises the non-volatile memory or by applying a label or a marking to the multichip module.

10. The method according to claim 9, further comprising using the at least one identification number to read the addresses stored in step (IV) of the earmarked faulty memory cells in the semiconductor memory component from the external database or from the label or marking, and storing the addresses in the at least one semiconductor memory component provided in step (I).

11. The method according to claim 9, wherein step (II) comprises subjecting the at least one semiconductor memory component to a memory functional test of the multichip module.

12. The method according to claim 9, wherein step (II) comprises subjecting the at least one semiconductor memory component to a burn-in test.

13. A method for correcting faults in at least one semiconductor memory component in an application system, said method comprising:

(I) providing the at least one semiconductor memory component at a wafer level or in a multichip module having a volatile memory;

(II) testing the at least one semiconductor memory component at the wafer level or in the multichip module and identifying earmarked faulty memory cells in the at least one semiconductor memory component;

(III) reading out at least one identification number of the at least one semiconductor memory component; and (IV) associating addresses of the earmarked faulty memory cells together with the at least one identification number of the at least one semiconductor memory component, by storing the addresses of the earmarked faulty memory cells in an external database or by applying a label or a marking to the multichip module;

(a) booting up of the application system, the application system having the multichip module comprising a package into which a plurality of integrated circuit chips are placed, the multichip module comprising:
the at least one semiconductor memory component,
a logic component, and
a diverting circuit and a replacement data memory that are on the logic component;

(b) reading, from the application system outside the multichip module, addresses of the earmarked faulty memory cells in the at least one semiconductor memory component into the multichip module; and (c) operating the application system having the at least one semiconductor memory component in such a manner that, responsive to one of the earmarked faulty memory cells in the at least one semiconductor memory component being accessed, the diverting circuit diverts access to a memory cell in the replacement data memory, wherein when the addresses of the earmarked faulty memory cells are associated with the at least one identification number of the at least one semiconductor memory component and stored in the external database, the following step (V) is carried out after step (IV) and before step (a):

(V) generating a further external database, which accepts the addresses of the earmarked faulty memory cells in the at least one semiconductor memory component, and which is configured to store further addresses of operational memory cells in the semiconductor memory component until a predefined number of addresses of memory cells has been reached.

14. The method according to claim 13, further comprising encrypting with an encryption code the addresses of the memory cells to be stored in the external database.

15. A system for correcting faults in at least one semiconductor memory component in an application system, the system comprising:
the application system having a multichip module comprising a package into which a plurality of integrated circuit chips are placed, the multichip module comprising:
the at least one semiconductor memory component containing a volatile memory,
a logic component, and
a diverting circuit and a replacement data memory that are on the logic component;
means for booting up of the application system; and
means for reading into the multichip module, from a non-volatile memory located within the application system and outside the multichip module, and after said booting up and during regular operation of the application system, addresses of earmarked faulty memory cells in the at least one semiconductor memory component,
wherein, the diverting circuit is configured to divert access to a memory cell in the replacement data memory responsive to one of the earmarked faulty memory cells in the semiconductor memory component being accessed.

16. The system according to claim 15, wherein the application system is a microcomputer.

17. The system according to claim 15, wherein the application system is a mobile telephone.

18. The system according to claim 15, wherein the replacement data memory is constructed from SRAM, flip-flop registers, or DRAM.

19. The system according to claim 15, wherein the diverting circuit comprises a comparator configured to compare the address of the one of the earmarked memory cells in the semiconductor memory component requested to be accessed to the addresses of earmarked memory cells in the semiconductor memory component.

20. The system according to claim 19, wherein the logic component is connected to the semiconductor memory component by an address bus, wherein a first input of the comparator is connected to the address bus, and wherein a second input of the comparator is configured to receive the addresses of the earmarked memory cells.

21. The method of claim 15, further comprising testing, prior to said regular operation, the multichip module using a testing device that is not part of the application system.

22. A system for correcting faults in at least one semiconductor memory component in an application system, the system comprising:
the application system having a multichip module comprising a package into which a plurality of integrated circuit chips are placed, the multichip module comprising:
the at least one semiconductor memory component containing a volatile memory,
a logic component, and
a diverting circuit and a replacement data memory that are on the logic component,
wherein the application system is configured to (1) boot up and to (2) read addresses, after said boot up and during regular operation of the application system, of earmarked faulty memory cells in the at least one semiconductor memory component into the multichip module from a non-volatile memory that is within the application system and that is outside the multichip module, and
wherein the diverting circuit is configured to divert access to a memory cell in the replacement data memory responsive to one of the earmarked faulty memory cells in the semiconductor memory component being accessed.

23. The system according to claim 22, wherein the system is configured such that the addresses of the earmarked faulty memory cells in the at least one semiconductor memory component are read into the multichip module from an external database by means of an electronic data connection.

24. The system according to claim 23, wherein the external database has a predetermined number of addresses of memory cells, only some of which are faulty.

25. The system of claim 22, further comprising a testing device separate from the application system and configured to test the multichip module.

26. A method, comprising:
reading into a multichip module, from a non-volatile memory outside the multichip module, addresses of earmarked memory cells in a semiconductor memory component, wherein said reading is performed (1) after booting up of a system comprising the multichip module and the non-volatile memory and (2) during regular operation of the system, and wherein the multichip module comprises:
the semiconductor memory component comprising a volatile memory, and
a logic component comprising a diverting circuit and a replacement data memory; and
responsive to a request to access one of the earmarked memory cells, the diverting circuit causing a memory cell in the replacement data memory to be accessed.

27. The method of claim 26, further comprising testing, prior to said reading in, the multichip module using a testing device that is not part of the system.

* * * * *